US008012876B2

(12) United States Patent
Oosterlaken

(10) Patent No.: US 8,012,876 B2
(45) Date of Patent: Sep. 6, 2011

(54) DELIVERY OF VAPOR PRECURSOR FROM SOLID SOURCE

(75) Inventor: Theodorus G. M. Oosterlaken, Oudewater (NL)

(73) Assignee: ASM International N.V. (NL)

( * ) Notice: Subject to any disclaimer, the term of this patent is extended or adjusted under 35 U.S.C. 154(b) by 388 days.

(21) Appl. No.: 12/326,792

(22) Filed: Dec. 2, 2008

(65) Prior Publication Data

US 2010/0136772 A1   Jun. 3, 2010

(51) Int. Cl.
H01L 21/44 (2006.01)
H01L 29/40 (2006.01)
(52) U.S. Cl. ........................ 438/680; 257/761
(58) Field of Classification Search .......... 438/679–681, 438/497, 782; 257/761–766; 427/582–590
See application file for complete search history.

(56) References Cited

U.S. PATENT DOCUMENTS

| 87,192 | A | 2/1869 | Paine |
|---|---|---|---|
| 113,147 | A | 3/1871 | Dupas et al. |
| 160,410 | A | 3/1875 | Ferguson |
| 230,656 | A | 8/1880 | Radkey |
| 1,103,789 | A | 7/1914 | Macey |
| 1,525,786 | A | 2/1925 | Waldo |
| 1,736,325 | A | 11/1929 | Parmelee |
| 1,860,111 | A | 5/1932 | Miller |
| 2,206,688 | A | 7/1940 | Bloomheart |
| 2,333,898 | A | 11/1943 | Stevenson et al. |
| 3,731,802 | A | 5/1973 | James |
| 3,912,795 | A | 10/1975 | Jackson |
| 3,957,467 | A | 5/1976 | Kim |
| 3,989,477 | A | 11/1976 | Wilson et al. |
| 4,262,631 | A | 4/1981 | Kubacki |
| 4,268,279 | A | 5/1981 | Shindo et al. |
| 4,276,243 | A | 6/1981 | Partus |
| 4,277,320 | A | 7/1981 | Beguwala et al. |
| 4,298,629 | A | 11/1981 | Nozaki et al. |
| 4,363,828 | A | 12/1982 | Brodsky et al. |
| 4,389,973 | A | 6/1983 | Suntola et al. |
| 4,393,013 | A | 7/1983 | McMenamin |
| 4,436,674 | A | 3/1984 | McMenamin |

(Continued)

FOREIGN PATENT DOCUMENTS

DE        33 39 625 C2     1/1991

(Continued)

OTHER PUBLICATIONS

Ikoma et al., Growth of Si/3C-SiC/Si (100) hetrostructures by pulsed supersonic free jets, Applied Physics Letters, Dec. 1, 1999, 3977-3979.

(Continued)

*Primary Examiner* — Calvin Lee
(74) *Attorney, Agent, or Firm* — Knobbe, Martens, Olson & Bear LLP

(57) ABSTRACT

A method is disclosed that uses solid precursors for semiconductor processing. A solid precursor is provided in a storage container. The solid precursor is transformed into a liquid state in the storage container. The liquid state precursor is transported from the storage container to a liquid holding container. The liquid state precursor is transported from the liquid holding container to a reaction chamber. The molten precursor allows the precursor to be metered in the liquid state. The storage container can be heated only when necessary to replenish the liquid holding container, thereby reducing the possibility of thermal decomposition of the precursor.

17 Claims, 1 Drawing Sheet

U.S. PATENT DOCUMENTS

| | | | |
|---|---|---|---|
| 4,495,218 A | 1/1985 | Azuma et al. |
| 4,548,138 A | 10/1985 | Korenberg |
| 4,585,671 A | 4/1986 | Kitagawa et al. |
| 4,610,859 A | 9/1986 | Miyagawa et al. |
| 4,684,542 A | 8/1987 | Jasinski et al. |
| 4,715,937 A | 12/1987 | Moslehi et al. |
| 4,720,395 A | 1/1988 | Foster |
| 4,774,032 A | 9/1988 | Coates et al. |
| 4,783,343 A | 11/1988 | Sato |
| 4,828,224 A | 5/1989 | Crabb et al. |
| 4,834,020 A | 5/1989 | Bartholomew |
| 4,849,259 A | 7/1989 | Biro et al. |
| 4,851,095 A | 7/1989 | Scobey et al. |
| 4,883,362 A | 11/1989 | Gärtner et al. |
| 4,891,103 A | 1/1990 | Zorinsky et al. |
| 4,904,419 A | 2/1990 | Reynolds |
| 4,911,101 A | 3/1990 | Ballingall, III et al. |
| 4,947,790 A | 8/1990 | Gärtner et al. |
| 5,053,132 A | 10/1991 | Sirkar |
| 5,143,526 A | 9/1992 | Lee et al. |
| 5,199,603 A | 4/1993 | Prescott |
| 5,204,314 A | 4/1993 | Kirlin et al. |
| 5,221,556 A | 6/1993 | Hawkins et al. |
| 5,227,329 A | 7/1993 | Kobayashi et al. |
| 5,272,880 A | 12/1993 | Nishizato et al. |
| 5,385,689 A | 1/1995 | Tom et al. |
| 5,389,398 A | 2/1995 | Suzuki et al. |
| 5,389,570 A | 2/1995 | Shiozawa |
| 5,451,260 A | 9/1995 | Versteeg et al. |
| 5,453,858 A | 9/1995 | Yamazaki |
| 5,536,323 A | 7/1996 | Kirlin et al. |
| 5,543,043 A | 8/1996 | Bates et al. |
| 5,551,278 A | 9/1996 | Rounbehler et al. |
| 5,607,724 A | 3/1997 | Beinglass et al. |
| 5,614,257 A | 3/1997 | Beinglass et al. |
| 5,648,293 A | 7/1997 | Hayama et al. |
| 5,656,531 A | 8/1997 | Thakur et al. |
| 5,674,574 A | 10/1997 | Atwell et al. |
| 5,695,819 A | 12/1997 | Beinglass et al. |
| 5,698,037 A | 12/1997 | Stauffer |
| 5,698,771 A | 12/1997 | Shields et al. |
| 5,700,520 A | 12/1997 | Beinglass et al. |
| 5,711,816 A | 1/1998 | Kirlin et al. |
| 5,719,417 A | 2/1998 | Roeder et al. |
| 5,786,027 A | 7/1998 | Rolfson |
| 5,789,030 A | 8/1998 | Rolfson |
| 5,837,580 A | 11/1998 | Thakur et al. |
| 5,874,129 A | 2/1999 | Beinglass et al. |
| 5,876,503 A | 3/1999 | Roeder et al. |
| 5,876,797 A | 3/1999 | Beinglass et al. |
| 5,885,869 A | 3/1999 | Turner et al. |
| 5,904,771 A | 5/1999 | Tasaki et al. |
| 5,907,792 A | 5/1999 | Droopad et al. |
| 5,916,365 A | 6/1999 | Sherman |
| 6,010,969 A * | 1/2000 | Vaartstra ............... 438/758 |
| 6,015,590 A | 1/2000 | Suntola et al. |
| 6,027,705 A | 2/2000 | Kitsuno et al. |
| 6,033,493 A | 3/2000 | Hertz et al. |
| 6,056,823 A | 5/2000 | Sajoto et al. |
| 6,082,714 A | 7/2000 | Dornfest et al. |
| 6,083,810 A | 7/2000 | Obeng et al. |
| 6,087,229 A | 7/2000 | Aronowitz et al. |
| 6,093,252 A | 7/2000 | Wengert et al. |
| 6,096,134 A | 8/2000 | Zhao et al. |
| 6,132,492 A | 10/2000 | Hultquist et al. |
| 6,136,654 A | 10/2000 | Kraft et al. |
| 6,159,828 A | 12/2000 | Ping et al. |
| 6,171,662 B1 | 1/2001 | Nakao |
| 6,197,669 B1 | 3/2001 | Twu et al. |
| 6,197,694 B1 | 3/2001 | Beinglass |
| 6,200,893 B1 | 3/2001 | Sneh |
| 6,220,091 B1 | 4/2001 | Chen et al. |
| 6,228,181 B1 | 5/2001 | Yamamoto et al. |
| 6,231,641 B1 | 5/2001 | Utigard et al. |
| 6,244,575 B1 | 6/2001 | Vaartstra et al. |
| 6,252,295 B1 | 6/2001 | Cote et al. |
| 6,258,170 B1 | 7/2001 | Somekh et al. |
| 6,271,054 B1 | 8/2001 | Ballantine et al. |
| 6,273,951 B1 | 8/2001 | Vaartstra |
| 6,325,017 B1 | 12/2001 | DeBoer et al. |
| 6,326,311 B1 | 12/2001 | Ueda et al. |
| 6,391,803 B1 | 5/2002 | Kim et al. |
| 6,409,839 B1 | 6/2002 | Sun et al. |
| 6,455,892 B1 | 9/2002 | Okuno et al. |
| 6,468,924 B2 | 10/2002 | Lee et al. |
| 6,503,846 B1 | 1/2003 | Niimi et al. |
| 6,528,530 B2 | 3/2003 | Zeitlin et al. |
| 6,537,910 B1 | 3/2003 | Burke et al. |
| 6,582,496 B1 | 6/2003 | Cheng et al. |
| 6,589,868 B2 | 7/2003 | Rossman |
| 6,613,695 B2 | 9/2003 | Pomarede et al. |
| 6,638,879 B2 | 10/2003 | Hsieh et al. |
| 6,640,840 B1 | 11/2003 | MacNeil |
| 6,783,590 B2 | 8/2004 | Lindfors et al. |
| 6,824,816 B2 | 11/2004 | Aaltonen et al. |
| 6,868,869 B2 | 3/2005 | Olander |
| 6,905,541 B2 | 6/2005 | Chen et al. |
| 7,005,392 B2 | 2/2006 | Baum et al. |
| 7,156,380 B2 | 1/2007 | Soininen |
| 7,182,979 B2 * | 2/2007 | Westmoreland et al. .. 427/248.1 |
| 7,186,385 B2 | 3/2007 | Ganguli et al. |
| 7,270,709 B2 | 9/2007 | Chen et al. |
| 7,464,917 B2 | 12/2008 | Lee et al. |
| 2001/0032986 A1 | 10/2001 | Miyasaka |
| 2001/0042523 A1 | 11/2001 | Kesala |
| 2002/0007849 A1 | 1/2002 | Wang et al. |
| 2002/0047151 A1 | 4/2002 | Kim et al. |
| 2002/0073925 A1 | 6/2002 | Noble et al. |
| 2002/0098627 A1 | 7/2002 | Pomarede et al. |
| 2002/0168868 A1 | 11/2002 | Todd |
| 2002/0192375 A1 | 12/2002 | Sun et al. |
| 2002/0197831 A1 | 12/2002 | Todd et al. |
| 2003/0022528 A1 | 1/2003 | Todd |
| 2003/0053799 A1 | 3/2003 | Lei |
| 2003/0059535 A1 | 3/2003 | Luo et al. |
| 2003/0082300 A1 | 5/2003 | Todd et al. |
| 2003/0175650 A1 | 9/2003 | De Ridder et al. |
| 2004/0016404 A1 | 1/2004 | Gregg et al. |
| 2005/0072357 A1 | 4/2005 | Shero et al. |
| 2005/0079692 A1 | 4/2005 | Samoilov et al. |
| 2005/0118837 A1 | 6/2005 | Todd et al. |
| 2005/0188923 A1 | 9/2005 | Cook et al. |
| 2005/0263075 A1 | 12/2005 | Wang et al. |
| 2006/0110930 A1 | 5/2006 | Senzaki |
| 2008/0173240 A1 | 7/2008 | Furukawahara et al. |

FOREIGN PATENT DOCUMENTS

| | | |
|---|---|---|
| GB | 2 151 662 A | 7/1985 |
| GB | 2 298 313 A | 8/1996 |
| JP | 57209810 | 12/1982 |
| JP | 59078918 | 5/1984 |
| JP | 59078919 | 5/1984 |
| JP | 60043485 | 3/1985 |
| JP | 61153277 | 7/1986 |
| JP | 62076612 | 4/1987 |
| JP | 63003414 | 1/1988 |
| JP | 63003463 | 1/1988 |
| JP | 1217956 | 8/1989 |
| JP | 1268064 | 10/1989 |
| JP | 2155225 | 6/1990 |
| JP | 3091239 | 4/1991 |
| JP | 3185817 | 8/1991 |
| JP | 3187215 | 8/1991 |
| JP | 3292741 | 12/1991 |
| JP | 4323834 | 11/1992 |
| JP | 5021378 | 1/1993 |
| JP | 5062911 | 3/1993 |
| JP | 7249618 | 9/1995 |
| JP | 8242006 | 9/1996 |
| JP | 11-168092 | 6/1999 |
| JP | 2002-090077 | 3/2002 |
| JP | 2002-220669 | 8/2002 |
| JP | 2006-045637 | 2/2006 |
| WO | WO 02/064853 | 8/2002 |
| WO | WO 2004/011695 | 2/2004 |

OTHER PUBLICATIONS

International Search Report and Written Opinion for International Application No. PCT/US2006/047805, May 8, 2007.
Iyer, R. Suryanarayanan et al., A Process Method of Silicon Nitride Atomic Layer Cyclic Deposition, Semicon, Jan. 1, 2001, 17-25.
Leskelä et al., "ALD precursor chemistry: Evolution and future challenges," *Journal de Physique* IV France 9, 837-852.
Smith, J.M., *Chemical Engineering Kinetics*, 3$^{rd}$ Edition, McGraw-Hill Book Company, p. 268-291 (1981).
Smith, J.M., *Chemical Engineering Kinetics*, 3$^{rd}$ Edition, McGraw-Hill Book Company, p. 554-563 (1981).
Suntola, "Atomic Layer Epitaxy," *Thin Solid Films*, 216: 84-89 (1992).

* cited by examiner

DELIVERY OF VAPOR PRECURSOR FROM SOLID SOURCE

BACKGROUND

1. Field of the Invention

The present application relates generally to semiconductor processing, and more particularly, to semiconductor processing using solid state precursors, such as in the deposition of thin films.

2. Description of the Related Art

Many semiconductor fabrication processes involve the deposition of films on substrates. In these deposition processes, a precursor or source material is flowed into a deposition, or reaction, chamber into which one or more substrates are loaded. The source material contacts and deposits on the substrates.

The source material may be flowed into the reaction chamber from a storage container. Deposition processes typically utilize gas phase precursors to accomplish the deposition. As a result, deposition equipment normally includes a system for delivering gas to the reaction chamber. In some cases, solid-state precursors can be dissolved to form a liquid that can be transported to a reaction chamber. The flow of the liquid can be controlled using a liquid flow controller. The source material delivery system, including the controller can be at a temperature slightly higher than room temperature, e.g., by placing the system in a cabinet at 30° C. for precursors such as tantalum pentaethoxide.

Solid state precursors are increasingly being used in deposition processes, particularly for Chemical Vapor Deposition (CVD), Metal Organic Chemical Vapor Deposition (MOCVD) or Atomic Layer Deposition (ALD). Accordingly, there is a continuing need for methods and systems for delivering the solid state precursors to a reaction chamber.

SUMMARY

In one aspect, the present application discloses a method of semiconductor processing. A solid state precursor is provided in a storage container and transformed into a liquid state in the storage container. The precursor in the liquid state is flowed from the storage container into a liquid holding container. The liquid state precursor is flowed from the liquid holding container to a reaction chamber.

In another aspect, the present application discloses another method of semiconductor processing. A solid state precursor is provided and melted into a liquid state to form a molten precursor. The molten precursor is metered in the liquid state, and introduced into a reaction chamber.

BRIEF DESCRIPTION OF THE DRAWING

The claimed methods and apparatuses will be better understood from the Detailed Description and from the appended FIGURE, which are meant to illustrate and not to limit the claims, and wherein:

DETAILED DESCRIPTION

Figure 1:
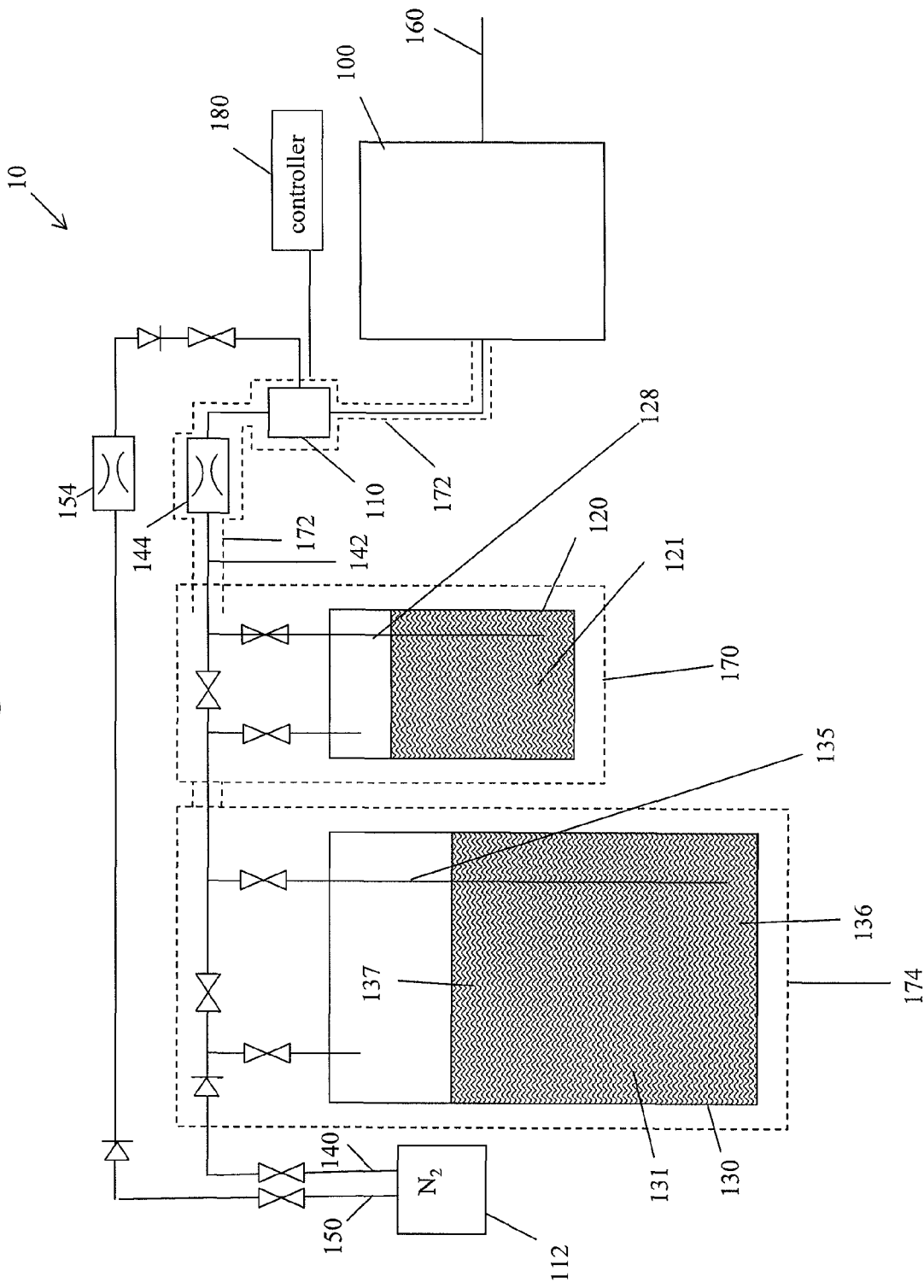
FIG. 1 illustrates an example of a semiconductor processing system for use with some embodiments of the invention.

Because gas phase precursors are desired for many deposition processes, much effort has been applied to developing systems for supplying solid state precursors to deposition chambers in gaseous form. Controlling the evaporation of a solid precursor has been found to be difficult. Consequently, to overcome the difficulty of handling solid precursors, solvents have been used to dissolve solid metal precursors. Liquid delivery systems have been used to deliver the dissolved precursors to a reaction chamber or an evaporator. See U.S. Pat. No. 5,204,314 and U.S. Pat. No. 5,820,664.

Solvent systems for liquid delivery have been found to have disadvantages. For example, the presence of a solvent can have an adverse effect on the deposition process. For example, the solvent can act as an impurity or cause undesirable reactions in the deposition process. In addition, solvents add cost to a semiconductor process. Also, environmental concerns can be connected with the use and discharging of some solvents into the external environment of the processing system.

Advantageously, embodiments of the invention allow solid state precursors to be utilized in liquid delivery systems without using solvents. In some embodiments, a precursor which is in the solid state under storage conditions, e.g., 1 atm and room temperature, is provided. The solid precursor is raised to a temperature above its melting point, to melt the precursor and change it into a liquid, or molten, state. The liquid state precursor is flowed into an intermediate liquid holding containing. From the liquid holding container, the liquid state precursor is flowed to a reaction chamber. In some embodiments, the liquid state precursor is flowed from the holding container into an evaporation chamber to be evaporated into the gaseous phase before being flowed into the reaction chamber. The precursors may be flowed into the reaction chamber and used in various vapor deposition processes, including CVD, MOCVD and ALD.

It will be appreciated that melting solid state precursors presents various challenges that can discourage the melting of the precursors for deposition processes. For example, for many solid precursors, heating them to a temperature above their melting points would require a very high temperature and result in thermal decomposition of the precursors as they are melted. Even where thermal decomposition does not result immediately, the precursors can be degraded over time. Deposition processes can occur over many hours or days, especially cyclic deposition processes such as ALD and some CVD processes. Moreover, to increase production capacity, it can be desirable to keep precursors ready in liquid form, continuously ready for use in deposition processes. Continual heating of the precursors above their melting points can decompose the precursors over time, however.

To minimize such decomposition, precursors used in some embodiments of the invention have a melting point that is lower than the decomposition temperature of the precursors. In certain embodiments, the melting point can be substantially higher than room temperature, e.g., 40° C. or more higher than room temperature, and still lower than the decomposition temperature of the precursors. For example, the precursors can have a melting temperature of about 100° C., which is relatively easy to generate and maintain to melt and keep the precursors in a liquid state. $TaF_5$, with a melting temperature of about 96.8° C., is an example of such a solid precursor. Heating $TaF_5$ precursors to about 130° C. or less, e.g., about 110° C., is sufficient to dose, or meter, and deliver $TaF_5$ precursors in a molten state to an evaporator. Other metal fluorides such as $NbF_5$ (with a melting temperature of about 79° C.) and $MoF_5$ (with a melting temperature of about 67° C.) are also suitable candidates for use in some embodiments. In addition, strontium cyclopentadienyl (Sr(CP)) compounds and barium cyclopentadienyl (Ba(CP)) compounds are solids under standard conditions, and they have relatively low melting points, which makes them suitable candidates for the solid precursors used in some embodiments. In some embodiments, the solid precursor is a solid under the conditions under which the precursor is stored (e.g., room temperature and a pressure of 1 atm) and has a melting point that is below the temperature at which significant thermal decomposition occurs. In some embodiments, the thermal stability of the precursor is such that it can be maintained for 24 hours or more, more preferably a week or more, most preferably a month or more at a temperature above the melting point without significant thermal decomposition, so that in these embodiments not more than about 1 vol. % of the stored precursor has a changed composition as compared to the composition of the precursor as delivered by the precursor supplier.

Advantageously, undesired decomposition is also controlled by use of the liquid holding container. The liquid holding container provides a ready, temporary supply of precursor, while allowing the main store of precursor to cool below the melting temperature, thereby preventing excessively long-term heating of the precursor. To further prevent long-term heating, the storage container can be designed such that only a part of the container, e.g., the lower part, is heated above the precursor's melting point. Pressure from above the melted part forces the molten precursor out of the storage container, while the unmelted precursor is protected from thermal decomposition.

Reference will now be made to the FIGURE.

FIG. 1 shows a semiconductor processing system 10 according to some embodiments of the invention. A solid state precursor 131 is provided in a solid precursor storage container 130. The storage container 130 can be heated by a heater 174 to a temperature that is above the melting point of the solid precursor 131. The lower region of the storage container 130 near the bottom end of the container 130 is designated 136, and the upper region of the storage container 130 near the top end of the container 130 is designated 137. A feed line 135 transports the molten precursor from the lower region 136 of the storage container to a liquid holding container 120 which stored the molten precursor as liquid state precursor 121.

The liquid holding container 120 is heated by a heater 170 to a temperature above the melting point of the precursor. Liquid precursor 121 is heated and maintained in the liquid state in the liquid holding container 120. The liquid holding container 120 is pressurized with $N_2$ and the molten precursor is driven out of the container by the $N_2$ gas. The $N_2$ gas is provided in a $N_2$ tank 112, and transported through pipe 140.

A feed line 128, which can be heated to a temperature above the melting temperature of the precursor, transports the molten precursor 121 from the lower region 136 of the liquid holding container 120 to an evaporator 110. A liquid flow controller 144 controls the flow of the molten precursor 121 from the liquid holding container 120 to the evaporator 110. The liquid flow controller 144 meters and regulates the flow of the molten precursor in the liquid state. The liquid flow controller 144 is preferably heated to maintain the precursor in the liquid state.

The evaporator 110 transforms liquid state precursors from a liquid state into a gaseous state. The evaporator is heated so as to provide a hot surface for evaporating the liquid state precursor. The hot surface is heated at a temperature above the vaporization temperature of the precursor. Evaporated precursors are then transported in a gas state from the evaporator 110 to the reaction chamber 100. In some arrangements, the liquid precursor 121 may be atomized in the evaporator 110, rather than vaporized. Subsequent evaporation may occur in the evaporator 110, in the reaction chamber 100 or in between the evaporator 110 and the reaction chamber 100.

After being vaporized or atomized, the precursor vapor or mist may be diluted with a flow of $N_2$ gas. The $N_2$ may be delivered from the $N_2$ tank to the evaporator 110 via the conduit 150. The $N_2$ gas flow is controlled by a gas flow controller 154. The diluted precursor is fed into the reaction chamber 100.

It will be appreciated that the various conduits or pipes through which the precursor flows may be heated and/or thermally insulated as necessary to keep the precursor in a liquid or vapor state, as desired. This heating or insulation system is represented by dashed lines around various structures through which the precursor flows. For example, the conduit 142, the flow controller 144, the evaporator 110 and the various conduits between these features and the reaction chamber 100 are heated by a heater system 172, which can be connected to a controller 180. The controller 180 can have resident in it a computer program having instructions to heat some or all of these various components (the devices 142, 144 and 110 and the various conduits between these features and the reaction chamber 100) to a temperature above the melting point of the precursor and/or above the boiling point of the precursor, as appropriate for the desired state for the precursor.

In some embodiment, the various components between the solid precursor storage container 130 and liquid holding container 120 are insulated and/or heated to maintain the precursor in a liquid state. For example, these components can be heated to a temperature above the melting point of the precursor. Components between the evaporator 110 and the reaction chamber 100 may be heated sufficiently to prevent undesired condensation of the precursor.

After feeding the gas phase precursor to the reaction chamber 100, the conduits through which the precursor is flowed to the reaction chamber may be purged with $N_2$ or another gas, preferably an inert gas, and/or evacuated to remove the precursor from the conduits. Exhaust gases are removed from the reaction chamber 100 through an exhaust pipe 160 that may be connected to a vacuum pump.

In some embodiments, the solid storage container 130 is heated as necessary to provide a desired amount of liquid state precursor to the liquid holding container 120. When it is not necessary to provide liquid precursor to the liquid holding container 120, the storage container 130 is allowed to cool. For example, after consuming part of the precursor 121 in the liquid holding container 120, the storage container 130 is heated to a temperature above the melting point of the solid precursor 131 and the molten precursor 121 is transported from the storage container to the liquid holding container 120. After transporting a desired amount of molten precursor 121 from the storage container 130 to the liquid holding container 120, the storage container 130 is cooled down to a temperature below the melting point of the precursor 131. Thus, the precursor is melted intermittently over the course of and before depleting all of the precursor from the storage container. Allowing the precursor to cool has the advantage of reducing thermal degradation of the precursor by reducing the total time that the precursor is exposed to elevated temperatures. In addition, allowing the precursor and its storage container to cool can help to avoid frequent container replacement by reducing the total time the container is heated.

In some other embodiments, the storage container can be heated unevenly. For example, the lower region of the container can be heated to a temperature above the melting point of the precursor; the upper region of the container is heated to a temperature below the melting point of the precursor or is not heated. As a result, only a portion of the precursor in the storage container is heated to a temperature above the melting point of the precursor. Advantageously, thermal degradation is minimized in the precursor portions that are not heated above the precursor's melting point.

Although in FIG. 1 feed line 135 is shown to conduct the molten precursor upward through the interior of the storage container 130, it can also be located exterior of the storage container 130 while being in communication with the lower region 136 of the container. The feed line 135 can then be provided with a heater. This would facilitate the heating and melting of only the bottom part of the precursor in the storage container 130 while preventing condensation of the molten precursor in other parts of the feed line 135.

Advantageously, the multi-stage supply system disclosed herein allows solid state precursors to be supplied to a reaction chamber for vapor phase reactions or depositions, while controlling precursor decomposition. A relatively small liquid holding container contains molten precursor and keeps the lines to the system pressurized. A larger storage container stores precursors in the solid state, and the storage container is only heated for the brief intervals that are required to transport liquid state precursors to the liquid holding container. The amount of liquid precursor transported to the liquid holding container can be determined by sensing the amount of precursor present in the liquid holding container, e.g. through weighing, level sensing or any other method known in the art. Alternatively, the amount of liquid precursor transported to the liquid holding container can be determined by metering the liquid flow during transport. Because the storage container is large, it is possible to heat the storage container unevenly, i.e., to heat the lower region of the storage container to a temperature above the melting point of the precursor while keeping the upper region of the storage container at a temperature that is below the melting point of the precursor. In this way, the part of the precursors in the upper region of the storage container is not in danger of decomposition caused by heating the precursors above the melting point.

By separating the precursor delivery into two stages, the precursors are heated for a shorter time, e.g., the precursors are only heated when they are needed in a liquid stated for flowing into a liquid holding container or when they are at the lower region of a storage container. Consequently, precursor decomposition is reduced. In addition, with a small liquid container, it is easier to keep the temperature in a narrow range so as to further reduce precursor decomposition by minimizing the occurrence of localized hot spots.

In some other embodiments, instead of a single storage container, multiple storage containers can be used to store the solid precursor. Some of the storage containers can be heated, while other storage containers are maintained at a relatively cool temperature. In this way, the total time that each storage container is heated is shortened. Also, empty storage containers can be replaced with minimal impact on the remainder of the semiconductor processing system. In addition, in some embodiments, different solid storage containers, containing different precursors, can be connected to a common liquid holding container, to deliver a precursor mixture to the reaction chamber.

Advantageously, embodiments of the invention allow the metering of precursors in a liquid state, which can be more accurate than metering precursors in the vapor phase. In addition, because precursors are transported and metered in a liquid state, it is feasible to deliver a relatively large dose of the precursor into the reaction chamber. Furthermore, the concentration of the precursor delivered into the reaction chamber can be higher than that typically delivered by a bubbler-based system since the precursor can be delivered to the reaction chamber or evaporator as a liquid that is pure precursor.

For purposes of discussing the invention and the advantages achieved over the prior art, certain details and advantages are described herein. Of course, it is to be understood that not necessarily all such details or advantages may be provided or achieved in accordance with any particular embodiment of the invention. Thus, for example, those skilled in the art will recognize that the invention may be embodied or carried out in a manner that achieves or optimizes one advantage or group of advantages as taught herein without necessarily achieving other advantages as may be taught or suggested herein.

Accordingly, it will be appreciated by those skilled in the art that various omissions, additions and modifications may be made to the methods and structures described above without departing from the scope of the invention. All such modifications and changes are intended to fall within the scope of the invention, as defined by the appended claims.

What is claimed is:

1. A method for semiconductor processing comprising:
   providing a precursor in a solid state in a storage container;
   intermittently heating the storage container to a temperature above the melting temperature of the precursor, thereby intermittently transforming the precursor from the solid state into a liquid state in the storage container;
   flowing the precursor, while in the liquid state, from the storage container into a liquid holding container; and
   flowing the precursor from the liquid holding container to a reaction chamber.

2. The method of claim 1, wherein the precursor in the solid state has a thermal stability and a melting point such that it can be maintained at a temperature above the melting point for at least 24 hours without significant thermal decomposition.

3. The method of claim 1, wherein the precursor comprises a precursor selected from the group consisting of $TaF_5$, $NbF_5$, $MoF_5$, $Sr(Cp)$ and $Ba(Cp)$.

4. The method of claim 1, further comprising providing an evaporating chamber, wherein flowing the precursor from the liquid holding container to the reaction chamber comprises:
   flowing the precursor in the liquid state into the evaporation chamber,
   vaporizing the precursor in the evaporation chamber; and
   subsequently flowing the precursor to the reaction chamber.

5. The method of claim 1, wherein all conduits between the storage container and the reaction chamber are maintained at a temperature above the melting point of the precursor.

6. The method of claim 1, wherein, after flowing a desired quantity of precursor from the storage container to the liquid holding container, the storage container is cooled to a temperature below the melting point of the precursor.

7. The method of claim 1, wherein the storage container is unevenly heated during transforming the precursor into the liquid state.

8. The method of claim 7, wherein, during unevenly heating the storage container, a lower region of the storage container is heated to a temperature above the melting point of the precursor and an upper region of the container has a temperature below the melting point of the precursor.

9. The method of claim 7, further comprising providing a precursor feed line for feeding the precursor to the reaction chamber, wherein the precursor feed line is in liquid communication with the lower region of the storage container and wherein the upper region of the storage container is pressurized with gas.

10. The method of claim 7, wherein the lower region of the storage container is cooled below the melting point between intermittently transforming the precursor into the liquid state.

11. The method of claim 1, further comprising metering a flow of the precursor between the liquid holding container and the reaction chamber.

12. The method of claim 11, wherein the flow of the precursor is metered in the liquid state between the liquid holding container and the reaction chamber.

13. The method of claim 11, wherein metering the precursor is performed with a liquid flow controller heated to a temperature about 40° C. or more higher than room temperature.

14. The method of claim 11, wherein flowing the precursor from the liquid holding container to the reaction chamber comprises introducing the metered precursor into the reaction chamber, wherein introducing the metered precursor into the reaction chamber deposits a film of material on a substrate in the reaction chamber.

15. The method of claim 14, wherein depositing the material comprises performing a chemical vapor deposition or an atomic layer deposition.

16. The method of claim 1, wherein transforming the precursor comprises heating the precursor to a temperature of about 130° C. or less.

17. The method of claim 16, wherein transforming the precursor comprises heating the precursor to a temperature about 40° C. or more higher than room temperature.

\* \* \* \* \*